United States Patent [19]
Bales

[11] Patent Number: 6,078,220
[45] Date of Patent: Jun. 20, 2000

[54] COMPLEMENTARY CLASS AB CURRENT AMPLIFIER

[75] Inventor: James Bales, Fort Collins, Colo.

[73] Assignee: National Semiconductor Corporation, Santa Clara, Calif.

[21] Appl. No.: 08/968,675

[22] Filed: Nov. 12, 1997

[51] Int. Cl.[7] .................................................. H03F 3/30
[52] U.S. Cl. ........................ 330/264; 330/267; 330/268
[58] Field of Search ................................... 330/264, 267, 330/268

[56] References Cited

U.S. PATENT DOCUMENTS

| | | | |
|---|---|---|---|
| 4,570,128 | 2/1986 | Monticelli | 330/267 |
| 4,814,723 | 3/1989 | Botti | 330/263 |
| 5,442,320 | 8/1995 | Kunst et al. | 330/267 |
| 5,444,419 | 8/1995 | Honda | 330/266 |
| 5,485,123 | 1/1996 | Kiehl | 330/264 |
| 5,521,553 | 5/1996 | Butler | 330/265 |

FOREIGN PATENT DOCUMENTS

| | | |
|---|---|---|
| 2646-386 | 4/1978 | Germany . |
| 1254-579 | 8/1986 | U.S.S.R. . |

OTHER PUBLICATIONS

Doug Smith, Mike Koen and Arthur F. Witulski, "Evolution of High–Speed Operational Amplifiers", IEEE Journal of Solid–State Circuits, vol. 29, No. 10, Oct. 1994, pp. 1166–1179.

*Primary Examiner*—Michael B Shingleton
*Attorney, Agent, or Firm*—Baker & McKenzie

[57] ABSTRACT

A complementary class AB current mirror circuit with a constant current gain which, when driven by a transconductance amplifier, provides a constant overall voltage gain over a wide range of output current. Such current mirror circuit includes cross-coupled pairs of current mirror circuits, both of which are driven by a common reference current and each of which selectively receives a respective portion of the input signal current. The upper pair of current mirror circuits includes: an input current mirror circuit which generates a drive current for the output stage of the lower pair of current mirror circuits; and an output current mirror circuit which generates the source, or "push," portion of the output signal current. The lower pair of current mirror circuits includes: an input current mirror circuit which generates a drive current for the output stage of the upper pair of current mirror circuits; and an output current mirror circuit which generates the sink, or "pull," portion of the output signal current.

23 Claims, 4 Drawing Sheets

COMPLEMENTARY CLASS AB CURRENT AMPLIFIER

BACKGROUND OF THE INVENTION

1. Field of the Invention

The present invention relates to class AB amplifier circuits, and in particular, to complementary class AB amplifiers using current mirror circuits.

2. Description of the Related Art

Class AB amplifier circuits enjoy some of the same advantages as class A and class B amplifier circuits (linear transfer function for class A, and relatively low power requirements for class B), while avoiding some of the disadvantages (high power dissipation for class A and output signal distortion for class B). However, when implemented in a common emitter configuration, class AB amplifier circuits share one disadvantage. A common emitter amplifier which is voltage driven has a voltage gain which is approximately proportional to its output current.

Accordingly, it would be desirable to have a class AB amplifier circuit configuration which provides for a more consistent gain which is less dependent upon its output current.

SUMMARY OF THE INVENTION

A complementary class AB current mirror circuit in accordance with the present invention has a constant current gain. Advantages include an output voltage range extending virtually to both power supply potentials, and a substantially constant overall voltage gain when driven by a transconductance amplifier circuit. Such constant voltage gain results in improved linearity and differential gain and phase performance.

In accordance with one embodiment of the present invention, a complementary class AB current mirror circuit with a constant current gain includes: a reference current source; upper and lower input nodes; an output node; an upper input current mirror circuit; an upper output current mirror circuit; a lower input current mirror circuit; and a lower output current mirror circuit. The reference current source is configured to provide upper and lower reference currents. The upper and lower input nodes are configured to receive one or both of first and second input currents, respectively. The output node is configured to receive and combine upper and lower currents and in accordance therewith provide an output current. The upper input current mirror circuit is coupled to the reference current source and the upper input node and is configured to conduct the upper reference current and receive a portion of the received first input current and in accordance therewith provide a lower drive signal. The upper output current mirror circuit is coupled to the upper input node and the output node and is configured to receive another portion of the received first input current and an upper drive signal and in accordance therewith provide the upper current. The lower input current mirror circuit is coupled to the reference current source, the lower input node and the upper output current mirror circuit, and is configured to conduct the lower reference current and receive a portion of the received second input current and in accordance therewith provide the upper drive signal. The lower output current mirror circuit is coupled to the lower input node and the upper input current mirror circuit, and is configured to receive another portion of the received second input current and the lower drive signal and in accordance therewith provide the lower current.

In accordance with another embodiment of the present invention, a method of amplifying a current signal with a constant current gain using complementary class AB current replication includes the steps of: receiving one or both of first and second input currents; conducting an upper reference current and receiving a portion of the received first input current and in accordance therewith generating a lower drive signal; receiving another portion of the received first input current and an upper drive signal and in accordance therewith generating an upper current; conducting the lower reference current and receiving a portion of the received second input current and in accordance therewith generating the upper drive signal; receiving another portion of the received second input current and the lower drive signal and in accordance therewith generating the lower current; and combining the upper and lower currents and in accordance therewith generating an output current.

These and other features and advantages of the present invention will be understood upon consideration of the following detailed description of the invention and the accompanying drawings.

DETAILED DESCRIPTION OF THE INVENTION

Figure 1:
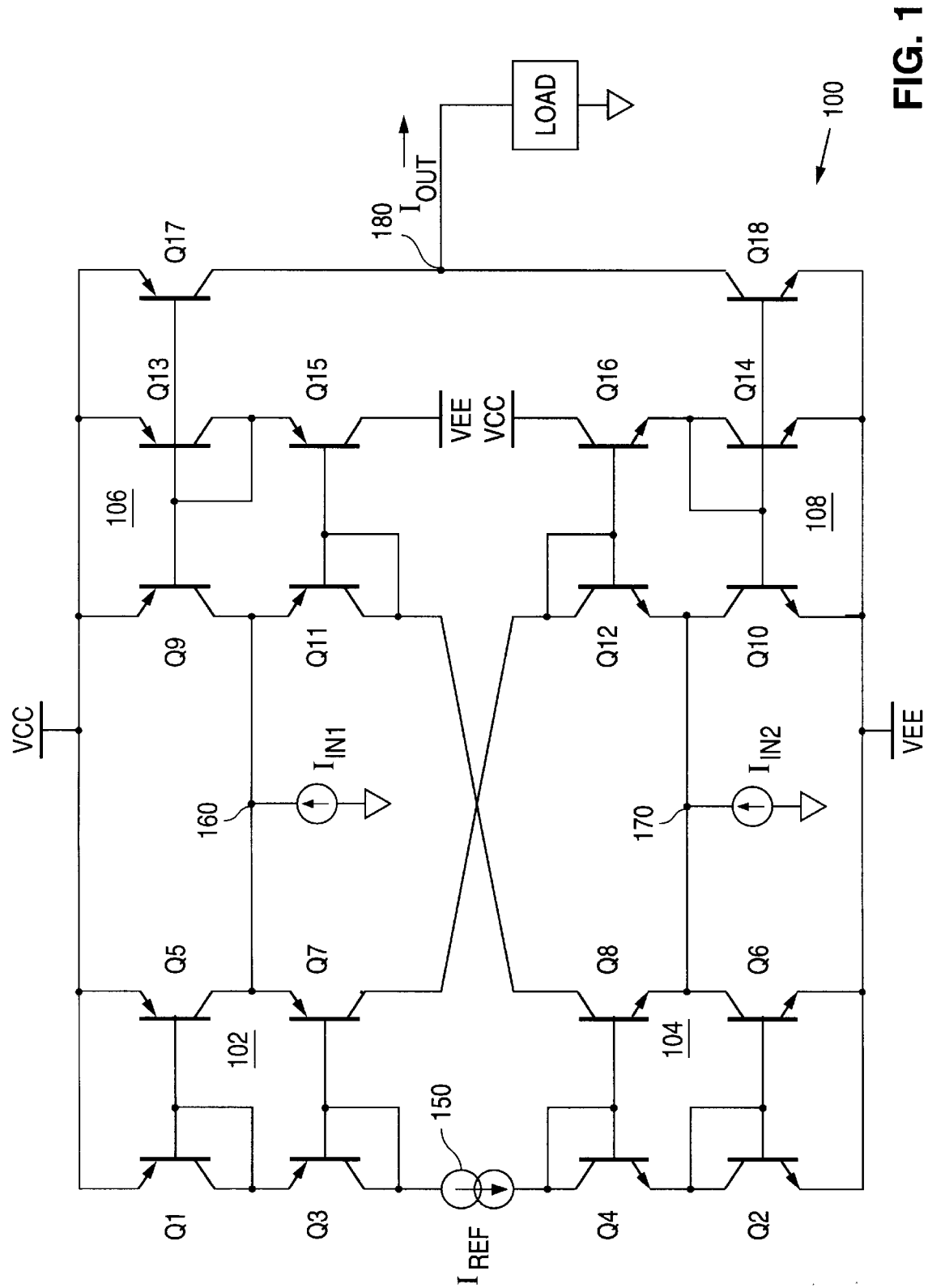
FIG. 1 is a schematic diagram of a complementary class AB current mirror circuit with a constant current gain in accordance with one embodiment of the present invention.

Referring to FIG. 1, a complementary class AB current mirror circuit 100 with a constant current gain in accordance with one embodiment of the present invention includes an input current source circuit 102, an input current sink circuit 104, an output current source circuit 106 and an output current sink circuit 108 implemented with bipolar junction transistors Q1–Q18, plus a reference current source 150 all interconnected between +VCC and −VEE power supply terminals substantially as shown. Input signals in the form of input currents $I_{IN1}$, $I_{IN2}$ are applied to the input nodes 160, 170, and the output signal in the form of an output current $I_{OUT}$ is provided at the output node 180.

The quiescent operating point of the circuit 100 is established by the DC reference current $I_{REF}$, supplied by the reference current source 150, and the area ratios of the transistors Q1–Q18. The reference current $I_{REF}$ is applied to diode-connected NPN transistors Q2 and Q4, thereby establishing the base voltage potentials for NPN transistors Q6 and Q8. Similarly, the reference current $I_{REF}$ is conducted by diode-connected PNP transistors Q1 and Q3, thereby establishing the base voltage potentials for PNP transistors Q5 and Q7. (It is presumed that the reference current conducted by NPN transistors Q2 and Q4 and that conducted by PNP transistors Q1 and Q3 are equal; however, separate reference currents could be provided for PNP transistors and NPN transistors, as desired, if such separate currents were deemed to provide a more advantageous implementation or operation for a specific application.)

With identical base-emitter voltages, NPN transistors Q2 and Q6 operate as a simple current mirror where the collector current of transistor Q6 is proportional to the collector current of transistor Q2 in accordance with their area ratio: $I_{C6}=(Area_{Q6}/Area_{Q2})*I_{REF}$. Similarly, PNP transistor Q5 has its collector current established in accordance with the collector current of PNP transistor Q1. (It will be recognized by one of ordinary skill in the art that even with identical area ratios, the collector current of transistor Q5 may be somewhat less than the collector current of transistor Q6 due to the typically lower current gain characteristics of PNP transistors as compared to those of NPN transistors.)

It should be noted that separate current source and sink circuits can be substituted for transistors Q5 and Q6 (which serve as the output devices of the current mirror circuits formed by transistor pairs Q1/Q5 and Q2/Q6), e.g., current sources which are independent in that they do not rely upon transistors Q1 and Q2 for biasing. For example, while retaining transistors Q1 and Q2 for their voltage level shifting performance, an independent current source circuit can be substituted for transistor Q5 to source what would otherwise have been the collector current of transistor Q5, and an independent current sink circuit can be substituted for transistor Q6 to sink what would otherwise have been the collector current of transistor Q6.

Transistors (NPN) Q10, Q14, Q16 and Q18 operate as a current mirror, with transistors Q10, Q14 and Q16 operating as a basic Wilson current mirror. With its base and emitter terminals connected directly to the base and emitter terminals of transistor Q10, output transistor Q18 has a collector current which is equal to the product of the collector current of transistor Q10 and the area ratio of transistor Q18 to Q10 (neglecting Early voltage effects). The quiescent collector current of transistor Q16 is approximately equal to the product of the collector current of transistor Q10 and the area ratio of transistor Q14 to Q10 (the actual quiescent collector current of transistor Q16 is higher by the amount of base current provided to transistors Q10, Q14 and Q18, with such difference becoming significant at current gains that are a significant fraction of its current gain characteristic β.)

Transistors (PNP) Q9, Q13, Q15 and Q17 operate as a current mirror in a similar and complementary manner. In general, it is desirable to match the current gains of the NPN and PNP transistor current mirror circuits. Diode-connected transistors Q11 (PNP) and Q12 (NPN) operate as voltage level shifters at the inputs of the current gain mirrors. These level shifters are quiescently biased by the collector currents of transistors Q8 and Q7, respectively. Since transistors Q7 and Q8 have fixed voltage potentials at their base terminals, the collector currents of transistors Q7 and Q8 are controlled by the voltage potentials at their emitter terminals which are coupled to the level shifters formed by transistors Q11 and Q12, respectively.

This quiescent operating point can be described as the mathematical solution for the following expressions:

$$V_{BE(Q2)}+V_{BE(Q4)}-V_{BE(Q8)}+V_{BE(Q12)}-V_{BE(Q16)}-V_{BE(Q18)}=0 \quad (1)$$

$$V_{BE(Q1)}+V_{BE(Q3)}-V_{BE(Q7)}+V_{BE(Q11)}-V_{BE(Q15)}-V_{BE(Q17)}=0 \quad (2)$$

Dynamic operation of this circuit 100 is intended to occur under two basic sets of conditions: (1) where input currents $I_{IN1}$ and $I_{IN2}$ are equal, i.e., $I_{IN1}=I_{IN2}=I_{IN}/2$; and (2) where each one of input currents $I_{IN1}$ and $I_{IN2}$ has a value between zero and $I_{IN}$ and such values sum together to $I_{IN}$, i.e., $I_{IN1}=A*I_{IN}$, $I_{IN2}=(1-A)*I_{IN}$ and $0 \leq A \leq 1$.

Dynamic operation where half of the input current $I_{IN}$ is applied to each current input node 160, 170 (i.e., $I_{IN1}=I_{IN2}=I_{IN}/2$) is as follows. Transistors Q5 and Q6 operate as current sources. Therefore the input currents $I_{IN1}$, $I_{IN2}$ must be sourced or sunk by transistors Q9 or Q10, respectively. When positive input current is supplied, the voltage potentials at the input nodes 160, 170 begin to increase. This causes increasing collector current in transistor Q7 and decreasing collector current in transistor Q8 (i.e., current magnitudes). The increasing collector current in transistor Q7 is directed into the output current sink circuit 108 (transistors Q10, Q14, Q16 and Q18) via voltage level shifter transistor Q12. The decreasing current in transistor Q8 reduces the current drawn from the output current source circuit 106 (transistors Q9, Q13, Q15 and Q17) with respect to its quiescent value.

In addition to the changing collector currents for transistors Q7 and Q8, the input currents $I_{IN1}$, $I_{IN2}$ are also applied to the output current source 106 and sink 108 circuits via the collector terminals of transistors Q9 and Q10. At large positive input current levels, nearly all of input current $I_{IN1}$ is transferred to the input of the output current sink circuit 108 via transistors Q7 and Q12, while input current $I_{IN2}$ is applied directly at the collector of transistor Q10. Under this condition, the output current source circuit 106 and transistor Q8 are almost completely shut off. For negative input current magnitudes, the circuit 100 operates in a similar, but complementary, manner.

Hence, at large positive input current levels, the NPN output current sink circuit 108 dominates circuit operation, while at large negative input current levels, the PNP output current source circuit 106 dominates circuit operation. During small signal operation, each current gain circuit 106, 108 contributes by operating on a respective half of the input current. This circuit 100 can source or sink output current $I_{OUT}$ (the sum of the collector current $I_{C17}$ sourced by transistor Q17 and the collector current $I_{C18}$ sunk by transistor Q18) which is an order of magnitude or greater than the quiescent operating current.

Dynamic operation where all of the input current $I_{IN}$ is applied to one of the input nodes 160, 170, e.g., $I_{IN1}=I_{IN}$ and $I_{IN2}=0$, is as follows. As positive current is applied to node 160 (with no input current applied to node 170), the voltage potential at input node 160 begins to rise. This causes an increasing collector current in transistor Q7 which is delivered to the NPN output current sink circuit 108. This, in turn, causes an increased voltage potential at the second input node 170 which reduces the collector current of transistor Q8, thereby reducing the current through the PNP output current source circuit 106.

At large positive input current levels, nearly all of the input current $I_{IN1}$ is transferred to the NPN output current sink circuit 108 through transistors Q7 and Q12, while the PNP output current source circuit 106 and transistor Q8 are almost completely shut off. As negative input current is applied the voltage potential at input node 160 decreases. Accordingly, the collector current in transistor Q7 decreases and the input current $I_{IN1}$, divides between decreasing the collector current of transistor Q7 and increasing the collector current of transistor Q9. The decreasing collector current of transistor Q7 causes the input current to the NPN output current sink circuit 108, i.e., the collector current of transistor Q12, to decrease. For negative input current, the transistor current through transistor Q8 remains relatively constant at the level of current provided by its associated current source transistor Q6. This, in turn, maintains the bias current to diode-connected voltage level shifting transistor Q11.

The output current $I_{OUT}$, which is the collector current sourced by transistor Q17, saturates at a relatively low value since the base current of output transistor Q17 is supplied by transistor Q15. The gain of the PNP output current source circuit 106 will become limited when additional base current is not available to transistor Q15. In this mode of operation, the base current of transistor Q15 is limited to the value of the collector current of transistor Q8 which, in turn, is approximately the value of the collector current of transistor Q6. Accordingly, due to this current limiting effect for the single input mode of operation, the above-discussed mode of operation with dual matching input currents $I_{IN1}$, $I_{IN2}$ is generally more advantageous.

Operation of this circuit 100 with a single input current at the second input node 170 (i.e., $I_{IN1}=0$ and $I_{IN2}=I_{IN}$) is similar, but complementary, to the operation discussed immediately above. However, due to the higher β of NPN transistors, a larger output current $I_{OUT}$ can be sunk by the NPN output transistor Q18.

Due to the common emitter configurations of the current source 102, 106 and sink 104, 108 circuits, some deviation from an ideal linear transfer function can be expected in practical designs. Improvements in the linearity of this transfer function can be realized by incorporating degeneration resistors in the emitter circuits of the current mirror transistors. For example, including degeneration resistors between the emitter terminals of transistors Q1, Q5, Q9, Q13, Q17, Q2, Q6, Q10, Q14 and Q18 and their respective power supply terminals VCC, VEE can improve the linearity substantially. However, one disadvantage is that the output voltage range becomes more limited due to the voltage drops across such resistors.

Based upon the foregoing discussion concerning the quiescent operating point, it can be seen that differential input currents applied to the two input nodes 160, 170, while changing the bias point, do not result in an output current $I_{OUT}$ (assuming a symmetrically matched circuit 100). Current sourced by the PNP current source circuit 106 must be sunk by either the emitter of transistor Q7 or the collector of transistor Q8. Current sunk by the NPN output current sink circuit 108 must be sourced by the emitter of transistor Q8 or collector of transistor Q7. If the PNP output current source circuit 106, NPN output current sink circuit 108 and voltage level shifting transistors Q11 and Q12 are matched in area, then the following current relationships, assuming negligible base currents, can be expressed as follows:

$$I_{C7}=I_{E7} \quad (3)$$

$$I_{C8}=I_{E8} \quad (4)$$

$$I_{C7}=I_{C8} \quad (5)$$

A stable bias, or operating, point is achieved where current delivered to the output current mirror results in a base-emitter voltage potential on transistors Q7 and Q8 such that the following current relationships exist:

$$I_{C7}+I_{C8}=I_{C6}+I_{C10} \text{ (NPN output current mirror current)} \quad (6)$$

$$I_{C7}+I_{C8}=I_{C5}+I_{C9} \text{ (PNP output current mirror current)} \quad (7)$$

Figure 2:
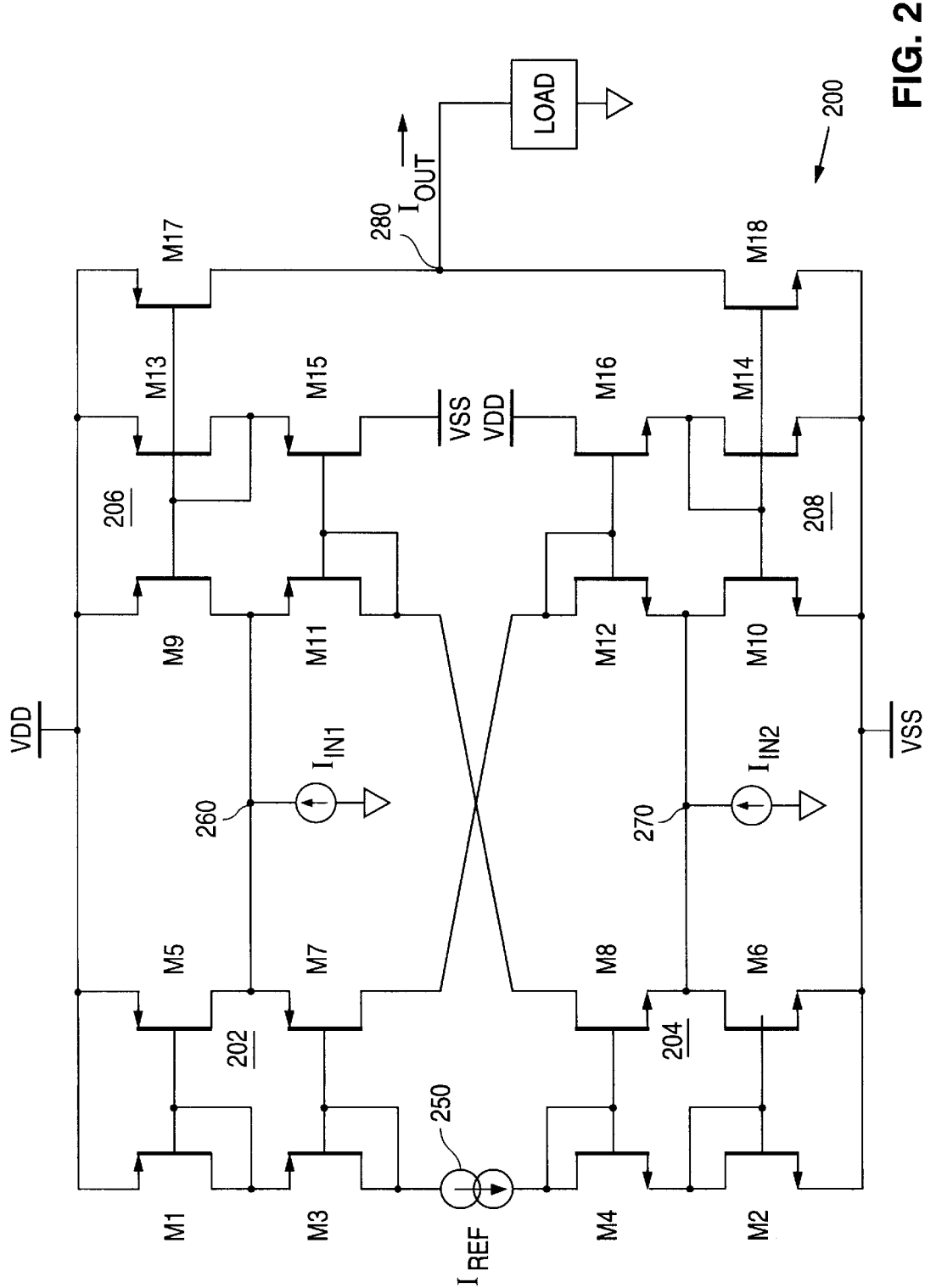
FIG. 2 is a schematic diagram of a complementary class AB current mirror circuit with a constant current gain in accordance with another embodiment of the present invention.

Referring to FIG. 2, another complementary class AB current mirror circuit 200 with a constant current gain in accordance with another embodiment of the present invention includes an upper input current mirror circuit 202, a lower input current mirror circuit 204, an upper output current mirror circuit 206 and a lower output current mirror circuit 208 implemented with P-channel and N-channel metal oxide semiconductor field effect transistors (P-MOSFETs and N-MOSFETs, respectively) in place of PNP and NPN bipolar junction transistors, respectively. Operation of this circuit 200 is similar to that of the circuit 100 FIG. 1, with one difference being larger internal voltage variations. Since the internal voltage variations are larger and this complementary MOSFET circuit does not suffer the low β limitations of the bipolar junction transistor circuit 100, a simpler configuration can be implemented.

Figure 3:
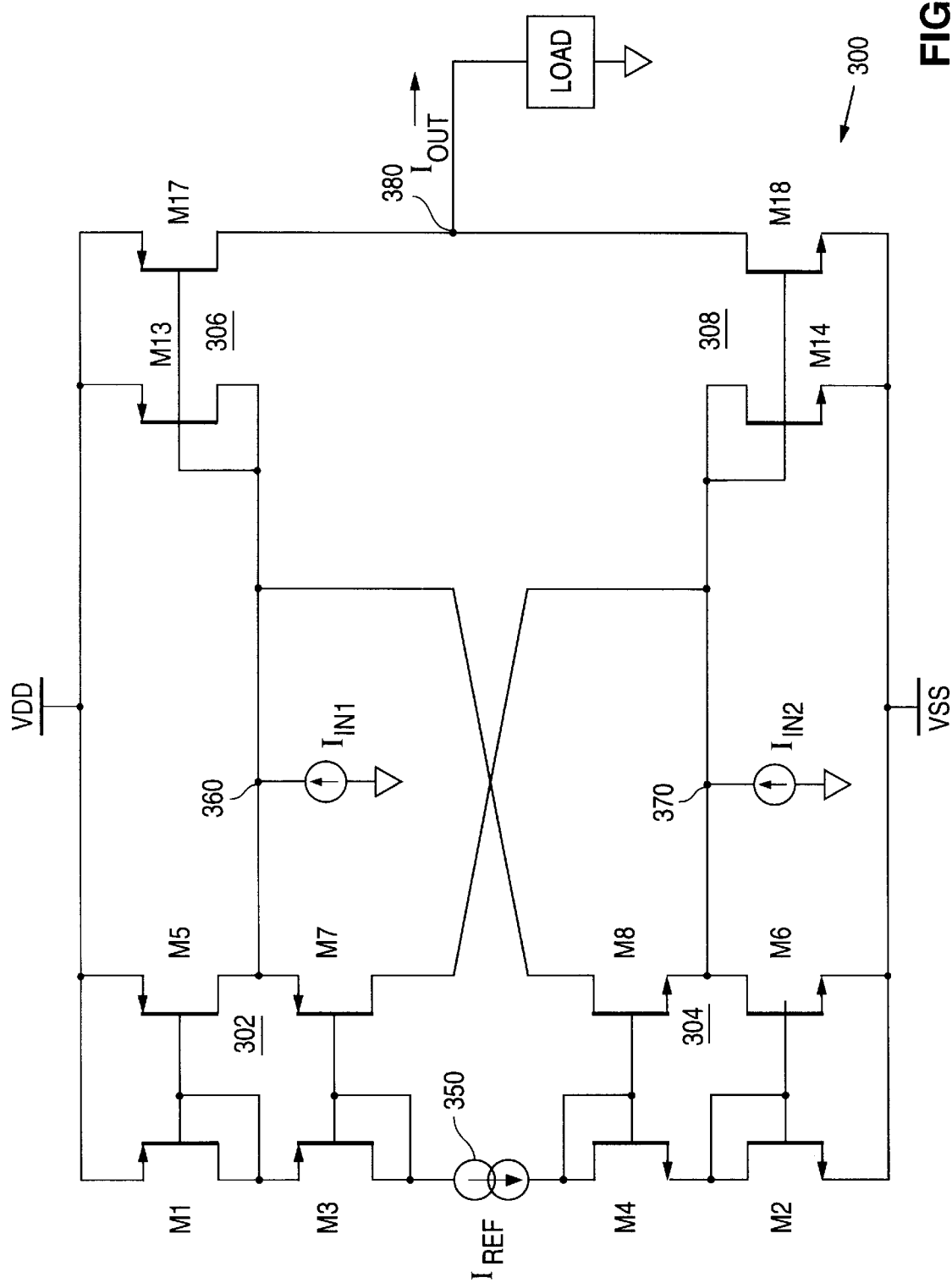
FIG. 3 is a schematic diagram of a complementary class AB current mirror circuit with a constant current gain in accordance with still another embodiment of the present invention.

Referring to FIG. 3, such a simpler configuration is as shown. This complementary class AB current mirror circuit 300 in accordance with still another embodiment of the present invention also includes an upper input current mirror circuit 302 and a lower input current mirror circuit 304, but has simpler output current mirrors 306, 308.

Figure 4:
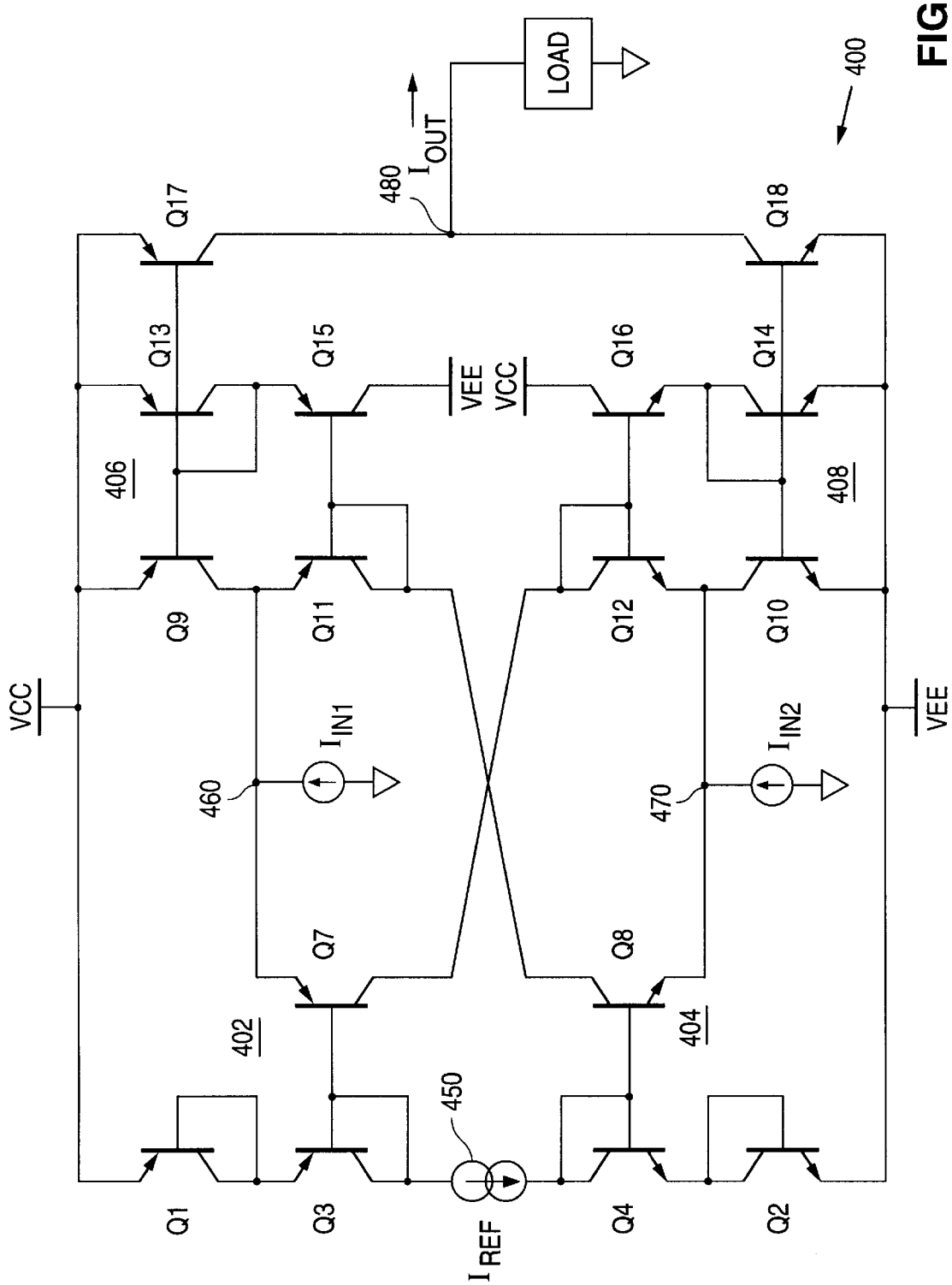
FIG. 4 is a complementary class AB current mirror circuit with a constant current gain in accordance with yet another embodiment of the present invention.

Referring to FIG. 4, it is possible to achieve the above-discussed bias, operating, point without transistors Q5 and Q6. This results in a complementary class AB current mirror circuit 400 in accordance with yet another embodiment of the present invention, as shown. (This circuit embodiment 400 represents the situation where transistors Q5 and Q6 have been replaced with independent current source and sink circuits having zero source and sink currents, respectively.) However, this circuit implementation 400 has the disadvantage that current sourcing capability is poor for a single input current drive (i.e., where $I_{IN1}=I_{IN}$ and $I_{IN2}=0$, or $I_{IN1}=0$ and $I_{IN2}=I_{IN}$) due to the limited base current drive available for transistors Q15 and Q16.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a complementary class AB current amplifier with a substantially constant current gain, comprising:

a reference current source configured to provide upper and lower reference currents;

upper and lower input nodes configured to receive one or both of first and second input signal currents, respectively;

an output node configured to receive and combine upper and lower signal currents and in accordance therewith provide an output signal current corresponding to said one or both of first and second input signal currents;

an input current source circuit, coupled to said reference current source and said upper input node, configured to conduct said upper reference current and receive a portion of said received first input signal current and in accordance therewith provide a lower drive signal;

an output current source circuit, coupled to said upper input node and said output node, configured to receive another portion of said received first input signal current and an upper drive signal and in accordance therewith provide said upper signal current;

an input current sink circuit, coupled to said reference current source, said lower input node and said output current source circuit, configured to conduct said lower reference current and receive a portion of said received second input signal current and in accordance therewith provide said upper drive signal; and an output current sink circuit, coupled to said lower input node and said input current source circuit, configured to receive another portion of said received second input signal current and said lower drive signal and in accordance therewith provide said lower signal current.

2. The apparatus of claim 1, wherein said upper and lower reference currents are equal.

3. The apparatus of claim 1, wherein said upper and lower reference currents comprise input and output currents, respectively, of said reference current source.

4. The apparatus of claim 1, wherein said input current source circuit comprises:

an upper buffer circuit, coupled to said reference current source, said output current sink circuit and said upper input node, configured to conduct said upper reference current and said received portion of said received first input signal current and in accordance therewith provide said lower drive signal; and an upper current mirror circuit, coupled to said upper buffer circuit and said upper input node, configured to conduct said upper reference current and in accordance therewith conduct a portion of said lower drive signal.

5. The apparatus of claim 4, wherein said input current sink circuit comprises:

a lower buffer circuit, coupled to said reference current source, said output current source circuit and said lower input node, configured to conduct said lower reference current and said received portion of said received second input signal current and in accordance therewith provide said upper drive signal; and a lower current mirror circuit, coupled to said lower buffer circuit and said lower input node, configured to conduct said lower reference current and in accordance therewith conduct a portion of said upper drive signal.

6. The apparatus of claim 1, wherein said input current sink circuit comprises:

a buffer circuit, coupled to said reference current source, said output current source circuit and said lower input node, configured to conduct said lower reference current and said received portion of said received second input signal current and in accordance therewith provide said upper drive signal; and a current mirror circuit, coupled to said buffer circuit and said lower input node, configured to conduct said lower reference current and in accordance therewith conduct a portion of said upper drive signal.

7. The apparatus of claim 1, wherein said input current source circuit comprises a cascode output current mirror circuit.

8. The apparatus of claim 7, wherein said input current sink circuit comprises a cascode output current mirror circuit.

9. The apparatus of claim 1, wherein said input current sink circuit comprises a cascode output current mirror circuit.

10. The apparatus of claim 1, wherein said output current source circuit comprises:

an upper level shifting circuit, coupled to said input current sink circuit and said upper input node, configured to receive said upper drive signal and in accordance therewith provide an upper bias signal; and an upper current mirror circuit, coupled to said upper level shifting circuit, said upper input node and said output node, configured to receive said upper bias signal and in accordance therewith provide said upper signal current.

11. The apparatus of claim 10, wherein said output current sink circuit comprises:

a lower level shifting circuit, coupled to said input current source circuit and said lower input node, configured to receive said lower drive signal and in accordance therewith provide a lower bias signal; and a lower current mirror circuit, coupled to said lower level shifting circuit, said lower input node and said output node, configured to receive said lower bias signal and in accordance therewith provide said lower signal current.

12. The apparatus of claim 1, wherein said output current sink circuit comprises:

a level shifting circuit, coupled to said input current source circuit and said lower input node, configured to receive said lower drive signal and in accordance therewith provide a lower bias signal; and a current mirror circuit, coupled to said level shifting circuit, said lower input node and said output node, configured to receive said lower bias signal and in accordance therewith provide said lower signal current.

13. The apparatus of claim 1, wherein:

said input and output current source circuits comprise a plurality of bipolar junction transistors of a first type; and said input and output current sink circuits comprise a plurality of bipolar junction transistors of a second type.

14. The apparatus of claim 1, wherein:

said input and output current source circuits comprise a plurality of field effect transistors of a first type; and said input and output current sink circuits comprise a plurality of field effect transistors of a second type.

15. The apparatus of claim 14, wherein:

said plurality of field effect transistors of a first type comprises a plurality of metal oxide semiconductor field effect transistors of a first type; and said plurality of field effect transistors of a second type comprises a plurality of metal oxide semiconductor field effect transistors of a second type.

16. A method of amplifying a current signal with a substantially constant current gain using complementary class AB current amplification, comprising the steps of:

receiving one or both of first and second input signal currents;

conducting an upper reference current and receiving a portion of said received first input signal current and in accordance therewith generating a lower drive signal with a current source circuit;

receiving another portion of said received first input signal current and an upper drive signal and in accordance therewith generating an upper signal current;

conducting said lower reference current and receiving a portion of said received second input signal current and in accordance therewith generating said upper drive signal;

receiving another portion of said received second input signal current and said lower drive signal and in accordance therewith generating said lower signal current; and combining said upper and lower signal currents and in accordance therewith generating an output signal current corresponding to said one or both of first and second input signal currents.

17. The method of claim 16, wherein said step of conducting an upper reference current and receiving a portion of said received first input signal current and in accordance therewith generating a lower drive signal comprises:

conducting said upper reference current and said received portion of said received first input signal current and in accordance therewith generating said lower drive signal; and conducting said upper reference current and in accordance therewith conducting a portion of said lower drive signal.

18. The method of claim 17, wherein said step of conducting said lower reference current and receiving a portion of said received second input signal current and in accordance therewith generating said upper drive signal comprises:

conducting said lower reference current and said received portion of said received second input signal current and in accordance therewith generating said upper drive signal; and conducting said lower reference current and in accordance therewith conducting a portion of said upper drive signal.

19. The method of claim 16, wherein said step of receiving another portion of said received first input signal current and an upper drive signal and in accordance therewith generating an upper signal current comprises:

receiving said upper drive signal and in accordance therewith generating an upper bias signal; and receiving said upper bias signal and in accordance therewith generating said upper signal current.

20. The method of claim 19, wherein said step of receiving another portion of said received second input signal current and said lower drive signal and in accordance therewith generating said lower signal current comprises:

receiving said lower drive signal and in accordance therewith generating a lower bias signal; and receiving said lower bias signal and in accordance therewith generating said lower signal current.

21. The method of claim 16, wherein said step of conducting said lower reference current and receiving a portion of said received second input signal current and in accordance therewith generating said upper drive signal comprises:

conducting said lower reference current and said received portion of said received second input signal current and in accordance therewith generating said upper drive signal; and conducting said lower reference current and in accordance therewith conducting a portion of said upper drive signal.

22. The method of claim 16, wherein said step of receiving another portion of said received second input signal current and said lower drive signal and in accordance therewith generating said lower signal current comprises:

receiving said lower drive signal and in accordance therewith generating a lower bias signal; and receiving said lower bias signal and in accordance therewith generating said lower signal current.

23. The method of claim 16, wherein said step of combining said upper and lower signal currents and in accordance therewith generating an output signal current comprises summing said upper and lower signal currents in a node and in accordance therewith generating said output signal current.

* * * * *